United States Patent
Cho et al.

(10) Patent No.: US 11,901,161 B2
(45) Date of Patent: *Feb. 13, 2024

(54) METHODS AND APPARATUS FOR SYMMETRICAL HOLLOW CATHODE ELECTRODE AND DISCHARGE MODE FOR REMOTE PLASMA PROCESSES

(71) Applicant: APPLIED MATERIALS, INC., Santa Clara, CA (US)

(72) Inventors: Tae Seung Cho, San Jose, CA (US); Saravana Kumar Natarajan, Tamil Nadu (IN); Kenneth D. Schatz, Los Altos, CA (US); Dmitry Lubomirsky, Cupertino, CA (US); Samartha Subramanya, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,977

(22) Filed: May 26, 2022

(65) Prior Publication Data

US 2022/0293396 A1    Sep. 15, 2022

Related U.S. Application Data

(63) Continuation of application No. 16/894,002, filed on Jun. 5, 2020, now Pat. No. 11,373,845.

(51) Int. Cl.
*H01J 37/32* (2006.01)
*H05H 1/46* (2006.01)

(52) U.S. Cl.
CPC .. *H01J 37/32357* (2013.01); *H01J 37/32128* (2013.01); *H01J 37/32596* (2013.01); *H05H 1/46* (2013.01)

(58) Field of Classification Search
None
See application file for complete search history.

(56) References Cited

U.S. PATENT DOCUMENTS

| 5,935,334 A | * | 8/1999 | Fong | ................. | H01L 21/02129 |
| | | | | | 257/E21.243 |
| 5,939,831 A | * | 8/1999 | Fong | ................. | H01L 21/67017 |
| | | | | | 134/1.1 |

(Continued)

FOREIGN PATENT DOCUMENTS

WO     WO-9928945 A1 *  6/1999  ........... C23C 16/455

OTHER PUBLICATIONS

International Search Report for PCT/US2021/029621, dated Aug. 17, 2021.

*Primary Examiner* — Srinivas Sathiraju
(74) *Attorney, Agent, or Firm* — MOSER TABOADA (57) ABSTRACT

Methods and apparatus for reducing particle generation in a remote plasma source (RPS) include an RPS having a first plasma source with a first electrode and a second electrode, wherein the first electrode and the second electrode are symmetrical with hollow cavities configured to induce a hollow cathode effect within the hollow cavities, and wherein the RPS provides radicals or ions into the processing volume, and a radio frequency (RF) power source configured to provide a symmetrical driving waveform on the first electrode and the second electrode to produce an anodic cycle and a cathodic cycle of the RPS, wherein the anodic cycle and the cathodic cycle operate in a hollow cathode effect mode.

20 Claims, 6 Drawing Sheets

(56) References Cited

U.S. PATENT DOCUMENTS

| | | | | |
|---|---|---|---|---|
| 5,973,447 A * | 10/1999 | Mahoney | | H01J 27/143 |
| | | | | 313/363.1 |
| 5,994,662 A * | 11/1999 | Murugesh | | H01J 37/321 |
| | | | | 156/345.36 |
| 6,026,762 A * | 2/2000 | Kao | | H01J 37/32357 |
| | | | | 315/111.21 |
| 6,039,834 A * | 3/2000 | Tanaka | | H01J 37/32862 |
| | | | | 204/298.38 |
| 6,077,357 A * | 6/2000 | Rossman | | C23C 16/4585 |
| | | | | 118/728 |
| 6,083,344 A * | 7/2000 | Hanawa | | H01J 37/32174 |
| | | | | 156/345.48 |
| 6,109,206 A * | 8/2000 | Maydan | | H01J 37/32862 |
| | | | | 156/345.35 |
| 6,189,483 B1 * | 2/2001 | Ishikawa | | H01J 37/32862 |
| | | | | 118/728 |
| 6,286,451 B1 * | 9/2001 | Ishikawa | | C23C 16/4405 |
| | | | | 118/724 |
| 6,499,425 B1 * | 12/2002 | Sandhu | | C23C 16/45574 |
| | | | | 156/345.44 |
| 7,211,179 B2 * | 5/2007 | Seymour | | H01J 37/3444 |
| | | | | 204/298.14 |
| 8,803,103 B2 * | 8/2014 | Nakasuji | | G01N 23/2251 |
| | | | | 250/397 |
| 8,980,379 B2 * | 3/2015 | Hanawa | | H01L 21/67115 |
| | | | | 427/248.1 |
| 9,117,855 B2 | 8/2015 | Cho et al. | | |
| 9,117,868 B1 * | 8/2015 | Nangoy | | H01L 21/67207 |
| 9,368,314 B2 * | 6/2016 | Nakasuji | | G01N 23/225 |
| 9,384,950 B2 * | 7/2016 | Duan | | C09D 7/61 |
| 9,396,989 B2 * | 7/2016 | Purayath | | H01L 21/31116 |
| 9,406,523 B2 * | 8/2016 | Chen | | H01L 21/32139 |
| 9,659,753 B2 | 5/2017 | Cho et al. | | |
| 9,773,648 B2 * | 9/2017 | Cho | | H01J 37/32449 |
| 9,932,670 B2 * | 4/2018 | Su | | C23C 16/4405 |
| 10,638,593 B2 * | 4/2020 | Long | | H03F 3/2173 |
| 11,049,755 B2 * | 6/2021 | Benjaminson | | H01L 21/67069 |
| 11,373,845 B2 * | 6/2022 | Cho | | H01J 37/32128 |
| 11,515,130 B2 * | 11/2022 | Hawrylchak | | H01L 21/67103 |
| 11,562,890 B2 * | 1/2023 | Lubomirsky | | C23C 16/4404 |
| 2001/0006093 A1 * | 7/2001 | Tabuchi | | C23C 16/50 |
| | | | | 156/345.43 |
| 2001/0017524 A1 | 8/2001 | Ishii | | |
| 2002/0020429 A1 * | 2/2002 | Selbrede | | H01J 37/32862 |
| | | | | 219/121.36 |
| 2004/0061051 A1 * | 4/2004 | Schneiker | | H01J 37/073 |
| | | | | 250/306 |
| 2005/0006222 A1 * | 1/2005 | Ding | | C23C 14/35 |
| | | | | 204/192.12 |
| 2005/0126487 A1 * | 6/2005 | Tabuchi | | C23C 16/50 |
| | | | | 118/723 E |
| 2005/0136604 A1 * | 6/2005 | Al-Bayati | | H01L 29/7843 |
| | | | | 438/301 |
| 2006/0131170 A1 * | 6/2006 | Seymour | | C23C 14/3478 |
| | | | | 204/298.08 |
| 2009/0145553 A1 * | 6/2009 | Chen | | H01J 37/32623 |
| | | | | 118/723 VE |
| 2009/0197015 A1 * | 8/2009 | Kudela | | H01J 37/32623 |
| | | | | 118/723 R |
| 2009/0218212 A1 * | 9/2009 | Denpoh | | C23C 16/509 |
| | | | | 156/345.43 |
| 2010/0006226 A1 * | 1/2010 | Cho | | H01J 37/32596 |
| | | | | 156/345.35 |
| 2010/0104771 A1 * | 4/2010 | Kudela | | H01J 37/32091 |
| | | | | 118/723 E |
| 2010/0210067 A1 * | 8/2010 | Butcher | | C23C 16/45523 |
| | | | | 257/E51.024 |
| 2010/0311249 A1 * | 12/2010 | White | | H01J 37/32091 |
| | | | | 427/523 |
| 2011/0052833 A1 * | 3/2011 | Hanawa | | C23C 16/45574 |
| | | | | 134/1.1 |
| 2011/0117728 A1 * | 5/2011 | Su | | H01L 21/67115 |
| | | | | 134/4 |
| 2011/0265821 A1 * | 11/2011 | Tay | | H01J 37/32642 |
| | | | | 118/504 |
| 2012/0108072 A1 * | 5/2012 | Angelov | | C23C 16/45565 |
| | | | | 239/548 |
| 2012/0234243 A1 * | 9/2012 | Olgado | | H01L 21/68742 |
| | | | | 118/729 |
| 2013/0255575 A1 * | 10/2013 | Chang | | H01J 37/32532 |
| | | | | 118/723 I |
| 2014/0049152 A1 * | 2/2014 | Baldwin | | H01J 21/26 |
| | | | | 313/306 |
| 2014/0116470 A1 * | 5/2014 | Su | | H01L 21/67115 |
| | | | | 134/22.1 |
| 2014/0305802 A1 * | 10/2014 | Ding | | C23C 14/046 |
| | | | | 204/298.16 |
| 2014/0319346 A1 * | 10/2014 | Nakasuji | | H01L 21/67213 |
| | | | | 250/336.1 |
| 2015/0060265 A1 | 3/2015 | Cho et al. | | |
| 2015/0083042 A1 | 3/2015 | Kobayashi et al. | | |
| 2015/0155189 A1 * | 6/2015 | Cho | | H01L 21/3065 |
| | | | | 438/731 |
| 2015/0221480 A1 * | 8/2015 | Duan | | C09D 7/61 |
| | | | | 106/286.5 |
| 2015/0332893 A1 * | 11/2015 | Tabuchi | | H01J 37/32009 |
| | | | | 118/723 R |
| 2015/0380218 A1 | 12/2015 | Tan et al. | | |
| 2016/0064232 A1 * | 3/2016 | Berry, III | | H01J 37/3053 |
| | | | | 438/712 |
| 2016/0218018 A1 * | 7/2016 | Liu | | H01L 21/32136 |
| 2016/0340782 A1 * | 11/2016 | Chandrasekharan | | |
| | | | | C23C 16/45544 |
| 2017/0069466 A1 * | 3/2017 | Tran | | H01J 37/32449 |
| 2017/0292633 A1 * | 10/2017 | Hill | | F16K 49/007 |
| 2017/0338083 A1 | 11/2017 | Chambers et al. | | |
| 2018/0025892 A1 | 1/2018 | Biquet et al. | | |
| 2019/0215942 A1 * | 7/2019 | Long | | H01J 37/32183 |
| 2019/0237298 A1 * | 8/2019 | Berry, III | | H01J 37/32422 |
| 2019/0252161 A1 * | 8/2019 | Sheng | | H01J 37/32669 |
| 2019/0271410 A1 * | 9/2019 | Hill | | F16K 1/22 |
| 2019/0272982 A1 * | 9/2019 | Hawrylchak | | H01J 37/3244 |
| 2019/0291214 A1 * | 9/2019 | Peng | | H01J 37/32495 |
| 2020/0185203 A1 * | 6/2020 | Lubomirsky | | C23C 16/46 |
| 2021/0100089 A1 * | 4/2021 | Daykin-Iliopoulos | | |
| | | | | H01J 37/32 |
| 2021/0126247 A1 * | 4/2021 | Herle | | C23C 14/14 |
| 2021/0249284 A1 * | 8/2021 | Prasad | | H01L 21/67248 |
| 2021/0384011 A1 * | 12/2021 | Cho | | H01J 37/32357 |
| 2022/0277936 A1 * | 9/2022 | Bajaj | | H01J 37/32495 |
| 2022/0293396 A1 * | 9/2022 | Cho | | H05H 1/46 |
| 2022/0350251 A1 * | 11/2022 | Lubomirsky | | H01J 37/32082 |
| 2023/0056566 A1 * | 2/2023 | Herle | | H01M 4/366 |
| 2023/0141688 A1 * | 5/2023 | Yamazaki | | H01J 37/32357 |
| | | | | 216/67 |

* cited by examiner

METHODS AND APPARATUS FOR SYMMETRICAL HOLLOW CATHODE ELECTRODE AND DISCHARGE MODE FOR REMOTE PLASMA PROCESSES

CROSS-REFERENCE TO RELATED APPLICATIONS

This application is a Continuation of and claims the benefit of U.S. patent application Ser. No. 16/894,002, filed Jun. 5, 2020, which is herein incorporated by reference in its entirety.

FIELD

Embodiments of the present principles generally relate to semiconductor chambers used in semiconductor processes.

BACKGROUND

Some process chambers may include a remote plasma source (RPS) for forming plasma remotely from a process chamber into which the radicals and/or ionized species are to be delivered. Conventionally, the RPS is connected to the processing chamber through a mixing reservoir for mixing a process gas stream provided by the RPS with a dilutant (or carrier) gas or other fluids prior to delivery to the chamber. Ions or radicals may then be dispersed into a processing volume of the process chamber to perform processes such as etching or cleaning. An RPS may include an RF electrode with a hollow cavity and a ground electrode consisting of a flat grounding plate. The RF electrode with the hollow cavity creates a hollow cathode mode that enhances electron impact ionization within the hollow cavity. The ground electrode with the flat grounding plate produces a glow discharge mode. The inventors have observed that if a sinusoidal driving system is used for such an RPS, particles may be produced during the glow discharge mode that cause defects on the wafers being processed.

Thus, the inventors have provided improved methods and apparatus to produce remote plasma without generating particles.

SUMMARY

Methods and apparatus for reduction of particle generation during remote plasma generation are provided herein.

In some embodiments, an apparatus for processing a substrate may comprise a process chamber with a chamber body enclosing a processing volume, a remote plasma source (RPS) having a first plasma source with a first electrode and a second electrode, wherein the first electrode and the second electrode are symmetrical with hollow cavities configured to induce a hollow cathode effect within the hollow cavities, and wherein the RPS provides radicals or ions into the processing volume and a radio frequency (RF) power source configured to provide a symmetrical driving waveform on the first electrode and the second electrode to produce an anodic cycle and a cathodic cycle of the RPS, wherein the anodic cycle and the cathodic cycle operate in a hollow cathode effect mode.

In some embodiments, the apparatus may further comprise wherein the symmetrical driving waveform is a sinusoidal waveform or a square wave waveform, an isolator between the first electrode and the second electrode, wherein the isolator has a ring shape, wherein the isolator has at least one groove on a radially inward side of the ring shape that is configured to be exposed to generated plasma from the first electrode and the second electrode, wherein the isolator is formed of a ceramic material, wherein the first electrode and the second electrode have hollow cavities with a cone shape having a first end with a first diameter opening and a second end with a second diameter opening, wherein the second diameter opening is larger than the first diameter opening, wherein the second diameter opening of the first electrode is configured to face the second diameter opening of the second electrode, a mixing reservoir located between the first plasma source and the processing volume, a second plasma source with a third electrode and a fourth electrode, wherein the third electrode and the fourth electrode are symmetrical with hollow cavities configured to induce a hollow cathode effect within the hollow cavities, and/or wherein the first plasma source and the second plasma source provide radicals or ions into a mixing reservoir that is fluidly connected to the processing volume.

In some embodiments, an apparatus for processing a substrate may comprise a remote plasma source (RPS) having a first plasma source with a first electrode and a second electrode, wherein the first electrode and the second electrode are symmetrical with hollow cavities configured to induce a hollow cathode effect within the hollow cavities and a radio frequency (RF) power source configured to provide a symmetrical driving waveform on the first electrode and the second electrode to produce an anodic cycle and a cathodic cycle of the RPS, wherein the anodic cycle and the cathodic cycle operate in a hollow cathode effect mode.

In some embodiments, the apparatus may further comprise wherein symmetrical driving waveform is a sinusoidal waveform or a square wave waveform, an isolator between the first electrode and the second electrode, wherein the isolator has a ring shape and is formed of a ceramic based material, and wherein the isolator has at least one groove on a radially inward side of the ring shape that is configured to be exposed to generated plasma from the first electrode and the second electrode, wherein the first electrode and the second electrode have hollow cavities with a cone shape having a first end with a first diameter opening and a second end with a second diameter opening, wherein the second diameter opening is larger than the first diameter opening, wherein the second diameter opening of the first electrode is configured to face the second diameter opening of the second electrode, and/or a second plasma source with a third electrode and a fourth electrode, wherein the third electrode and the fourth electrode are symmetrical with hollow cavities configured to induce a hollow cathode effect within the hollow cavities, and wherein the first plasma source and the second plasma source provide radicals or ions into a mixing reservoir that is fluidly connected to a processing volume of a process chamber.

In some embodiments, a method of generating remote plasma for a process chamber may comprise generating a symmetrical driving waveform with a radio frequency (RF) power source for a first plasma source and forming plasma in the first plasma source by applying the symmetrical driving waveform to a first electrode and to a second electrode of the first plasma source, wherein the first electrode and the second electrode are symmetrical with hollow cavities configured to induce a hollow cathode effect within the hollow cavities when driven by the symmetrical driving waveform.

In some embodiments, the method may further comprise forming plasma in a second plasma source by applying the symmetrical driving waveform to a third electrode and to a fourth electrode of the second plasma source, wherein the third electrode and the fourth electrode are symmetrical with hollow cavities configured to induce a hollow cathode effect within the hollow cavities when driven by the symmetrical driving waveform, and/or mixing radicals or ions generated by the first plasma source and the second plasma source in a mixing reservoir that is fluidly coupled to a processing volume of a process chamber.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide an improved remote plasma source (RPS) with symmetrical hollow electrodes that produce hollow cathode effect modes for anodic and cathodic cycles of a symmetrical RF drive system. The improved RPS eliminates the glow discharge mode for anodic cycles found in typical RPS systems which causes particle generation in the process chamber, leading to wafer defects and lower wafer output. The methods and apparatus of the present principles use a symmetrical electrode configuration along with a symmetrical driving voltage waveform to generate the hollow cathode discharge modes. The symmetrical electrode and driving configuration enables higher power to be used without particle generation and increases throughput. In addition, elimination of the glow discharge mode increases the lifetime of the RF system by preventing a buildup on an isolator used between the electrodes. The symmetrical hollow cavity electrodes may be used with RF power systems with symmetrical driving waveforms with frequencies ranging from 10's of kilohertz to 100's of kilohertz to enable a hollow cathode effect mode for both the cathodic and the anodic cycles. The inventors found that the symmetrical waveform has the benefit of neutralizing charged particles that accumulate in a previous cycle. A symmetrical waveform may include, but is not limited to, a sinusoidal waveform or a square wave waveform and the like.

Some process chambers have an asymmetrical electrode configuration that gives two different discharge modes consisting of a hollow cathode mode and a glow discharge mode for cathodic and anodic cycles. The inventors have found that the glow discharge mode causes particles to be generated from sputtering of the electrodes due to high energy ion bombardment. The generated particles may fall on a wafer and affect the performance of the semiconductor. Particle performance was found to be even worse for higher RF power, seriously limiting the throughput as the RF power must be reduced to increase particle performance and reduce particle generation.

Figure 1:
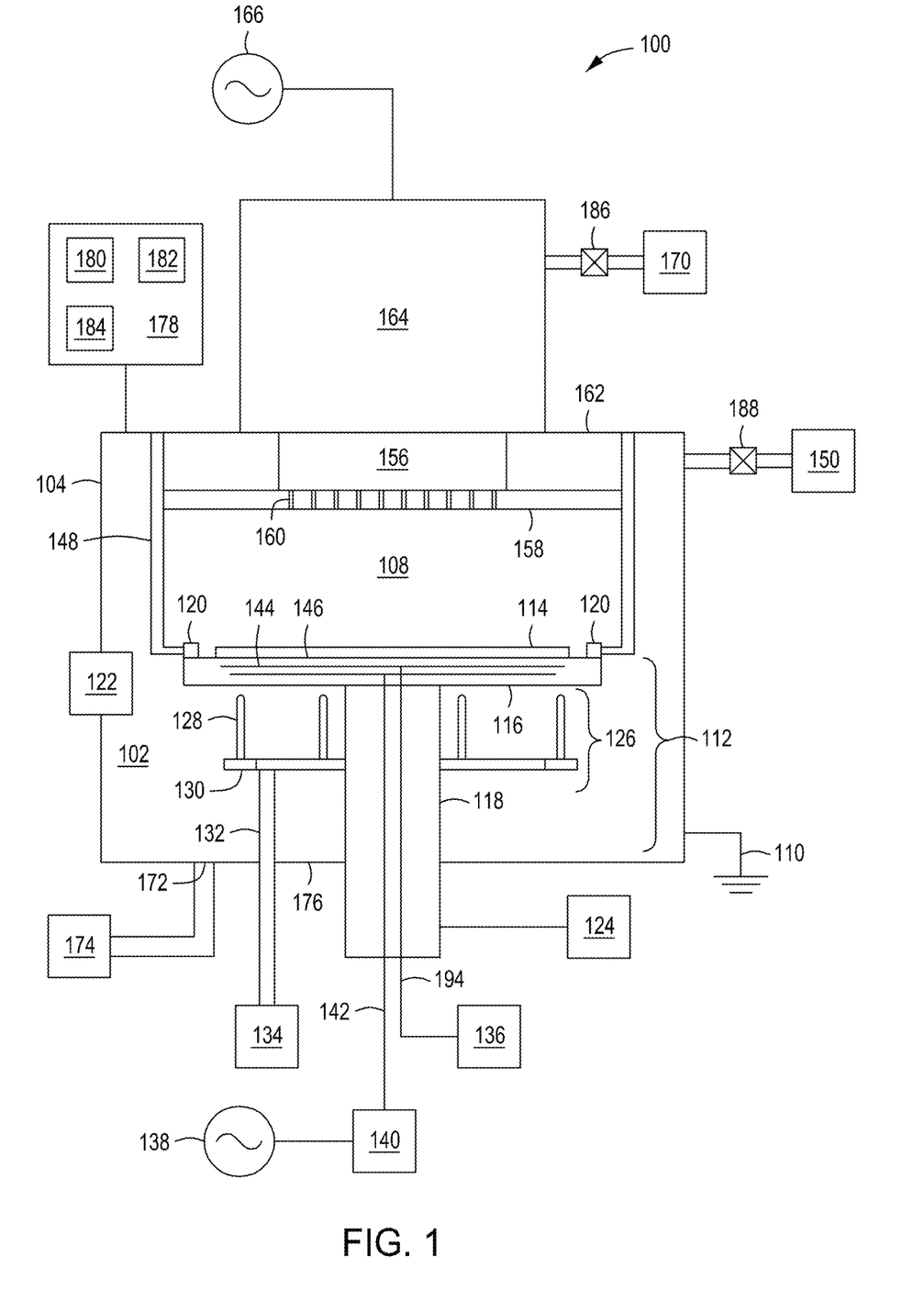
FIG. 1 depicts a schematic cross-sectional view of a process chamber with a remote plasma source in accordance with some embodiments of the present principles.

The methods and apparatus may be used for different types of process chambers such as preclean chambers or etch chambers and the like. As an example chamber use, FIG. 1 depicts a cross-sectional view of a process chamber 100 with a remote plasma source 164 in accordance with some embodiments. The process chamber 100 is a vacuum chamber which is adapted to maintain sub-atmospheric pressures within an interior volume 102 during substrate processing. In some embodiments, the process chamber 100 can maintain a pressure of approximately 1 mTorr to 100 Torr. The process chamber 100 includes a chamber body 106 which encloses a processing volume 108 located in the upper half of the interior volume 102. The chamber body 104 may be made of metal, such as aluminum and the like. The chamber body 104 may be grounded via a coupling to ground 110.

A substrate support 112 is disposed within the interior volume 102 to support and retain a substrate 114, such as a semiconductor wafer, for example, or other such substrate. The substrate support 112 may generally comprise a pedestal 116 and a hollow support shaft 118 for supporting the pedestal 116. The pedestal 116 may be composed of an aluminum-based material or a ceramic-based material and the like. A pedestal formed of a ceramic-based material may be used for high temperature processes. The hollow support shaft 118 provides a conduit to provide, for example, backside gases, process gases, fluids, coolants, power, or the like, to the pedestal 116. In some embodiments, the substrate support 112 includes a focus ring 120 disposed about the pedestal 116 to enhance process uniformity at an edge of the substrate 114. In some embodiments, the focus ring 120 is made of quartz-based materials. In some embodiments, the focus ring 120 is made of ceramic-based materials. The ceramic-based material facilitates high pressure process capabilities. A slit valve 122 may be coupled to the chamber body 104 to facilitate in transferring the substrate 114 into and out of the interior volume 102.

In some embodiments, the hollow support shaft 118 is coupled to a lift actuator 124, such as a motor, which provides vertical movement of the pedestal 116 between upper, processing position, and a lower, transfer position. A substrate lift 126 can include lift pins 128 mounted on a platform 130 connected to a shaft 132 which is coupled to a second lift actuator 134 for raising and lowering the substrate lift 126 so that the substrate 114 may be placed on or removed from the pedestal 116. The pedestal 116 may include through-holes to receive the lift pins 128. The hollow support shaft 118 provides a path for a gas conduit 194 for coupling a backside gas supply 136 and/or an RF power supply 138 to the pedestal 116. In some embodiments, the RF power supply 138 provides bias power through a matching network 140 to a power conduit 142 to the pedestal 116. In some embodiments, RF energy supplied by the RF power supply 138 may have a frequency of about 2 MHz or greater. In some embodiments, the RF power supply 138 may have a frequency of about 13.56 MHz.

In some embodiments, the backside gas supply 136 is disposed outside of the chamber body 104 and supplies gas to the pedestal 116. In some embodiments, the pedestal 116 includes a gas channel 144, allowing gas to interact with a backside of the substrate 114 to maintain a given temperature. The gas channel 144 is configured to provide backside gas, such as nitrogen (N), argon (Ar), or helium (He), to an upper surface 146 of the pedestal 116 to act as a heat transfer medium. The gas channel 144 is in fluid communication with the backside gas supply 136 via gas conduit 194 to control the temperature and/or temperature profile of the substrate 114 during use. For example, the backside gas supply 136 can supply gas to cool and/or heat the substrate 1114 during use. In some embodiments, the substrate 114 may be heated from approximately 60 degrees Celsius to approximately 450 degrees Celsius.

The process chamber 100 includes a process kit circumscribing various chamber components to prevent unwanted reaction between such components and contaminants. The process kit includes an upper shield 148. In some embodiments, the upper shield 148 may be made of metal, such as aluminum. In some embodiments, the process kit may be constructed of quartz. In some embodiments, a mixing reservoir 156 is coupled to and in fluid communication with the processing volume 108. The mixing reservoir 156 is also fluidly connected to the RPS 164. The mixing reservoir 156 allows mixing of the plasma gases with other gases provided by a gas delivery system 150. A rate of flow of the other gases from the gas delivery system 150 may be controlled by a first flow valve 188.

A showerhead 158 is located above the processing volume 108 and below a ceiling 162 of the chamber body 104. The showerhead 158 includes through-holes 160 to flow gases from the mixing reservoir 156 into the processing volume 108. The RPS 164 is fluidly connected to the mixing reservoir 156 to allow ionized gases to flow from the RPS 164 into the mixing reservoir 156, through the showerhead 158, and into the processing volume 108. Plasma is generated in the RPS 164 by a plasma RF power source 166 that provides RF energy to the RPS 164. Process gases used to form the plasma are supplied by a process gas source 170 and controlled by a second flow valve 186. The plasma gases supplied by the process gas source 170 may include, but are not limited to, hydrogen, helium, and/or argon and the like. The RPS 164 produces ions and radicals of the process gas to facilitate in processing the substrate 114.

A pump port 172 is configured to facilitate removal of particles and gases from the interior volume 102. The process chamber 100 is coupled to and in fluid communication with a vacuum system 174 which includes a throttle valve (not shown) and pump (not shown) which are used to exhaust the process chamber 100. In some embodiments, the vacuum system 174 is coupled to the pump port 172 disposed on a bottom surface 176 of the chamber body 104. The pressure inside the process chamber 100 may be regulated by adjusting the throttle valve and/or vacuum pump. In some embodiments, the pump has a flow rate of approximately 1900 liters per second to approximately 3000 liters per second. In some embodiments, the vacuum system 174 may be used to facilitate in regulating the substrate temperature.

In some embodiments, a controller 178 is used for the operation of the process chamber 100. The controller 178 may use direct control of the process chamber 100 or alternatively, use indirect control of the process chamber 100 by controlling computers (or controllers) associated with the process chamber 100. In operation, the controller 178 enables data collection and feedback from the process chamber 100 to optimize performance of the process chamber 100. The controller 178 generally includes a Central Processing Unit (CPU) 180, a memory 182, and a support circuit 184. The CPU 180 may be any form of a general-purpose computer processor that can be used in an industrial setting. The support circuit 184 is conventionally coupled to the CPU 180 and may comprise a cache, clock circuits, input/output subsystems, power supplies, and the like. Software routines, such as a method as described below may be stored in the memory 182 and, when executed by the CPU 180, transform the CPU 180 into a specific purpose computer (controller 178). The software routines may also be stored and/or executed by a second controller (not shown) that is located remotely from the process chamber 100.

The memory 182 is in the form of computer-readable storage media that contains instructions, when executed by the CPU 180, to facilitate the operation of the semiconductor processes and equipment. The instructions in the memory 182 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
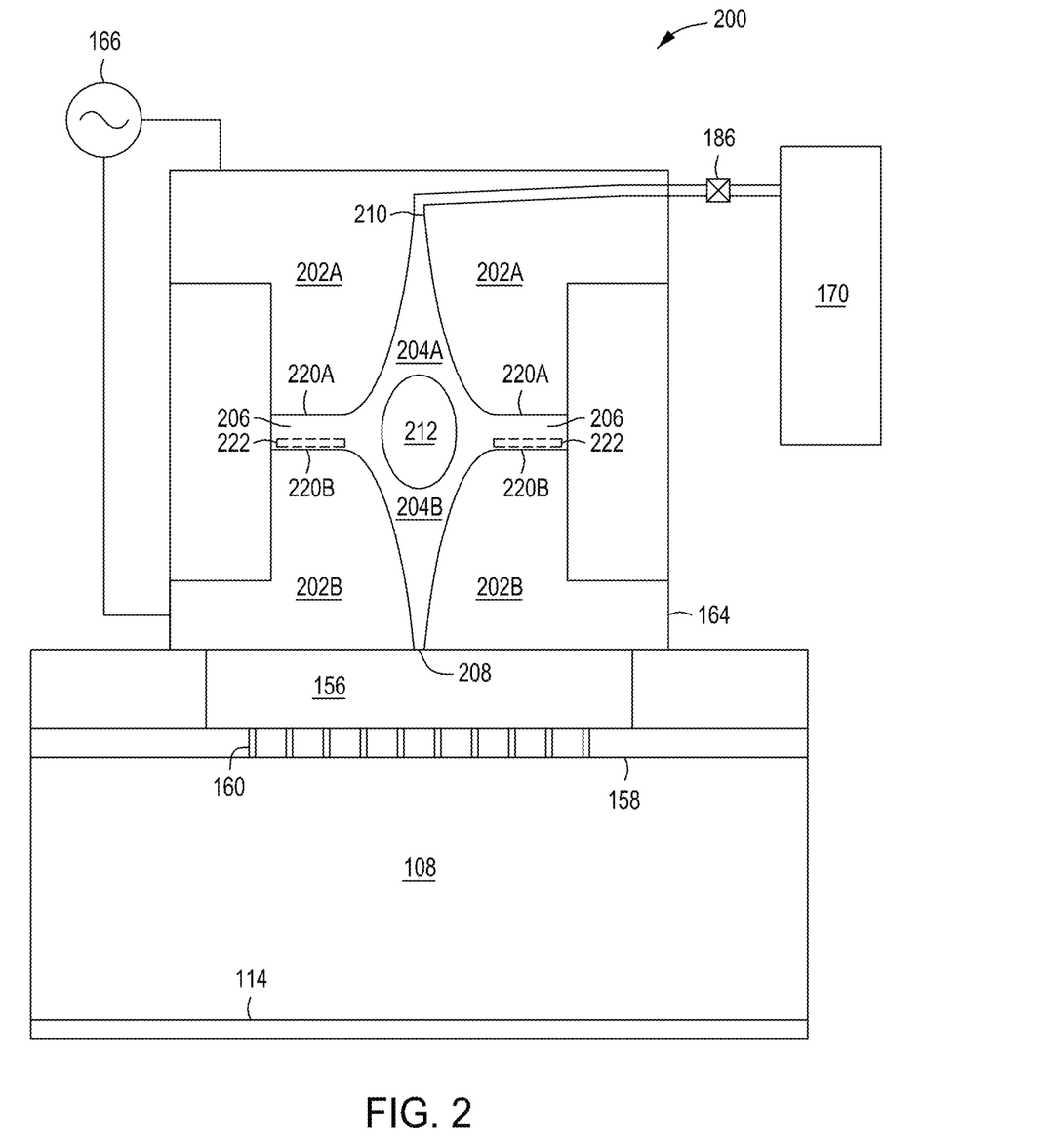
FIG. 2 depicts a schematic cross-sectional view of a plasma source with symmetric electrodes in accordance with some embodiments of the present principles.
Figure 9:
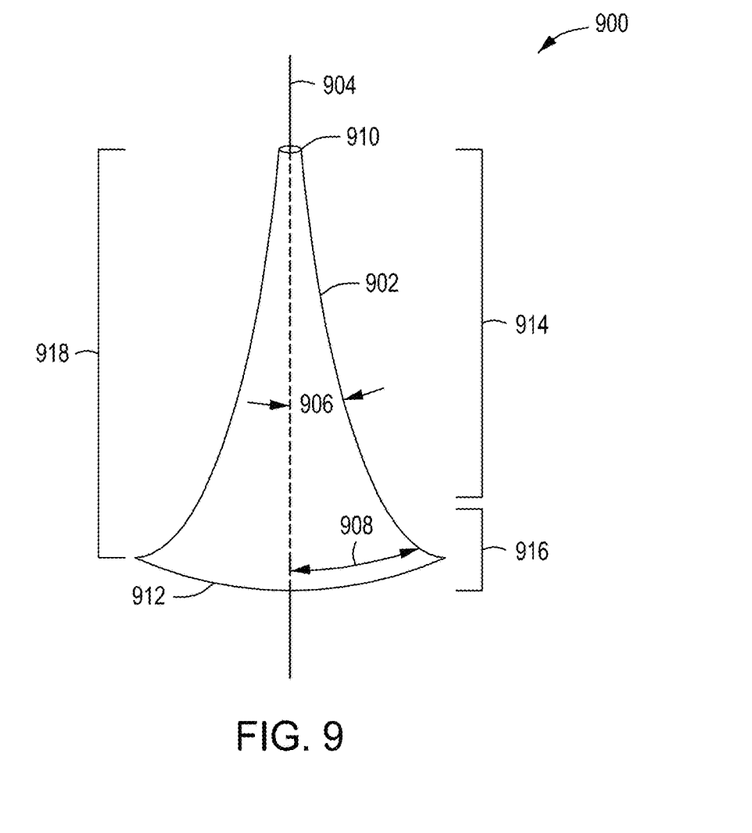
FIG. 9 depicts a hollow cathode effect cavity in accordance with some embodiments of the present principles.

FIG. 2 depicts a cross-sectional view of a plasma source 200 with a first electrode that is an upper symmetric electrode 202A and a second electrode that is a lower symmetric electrode 202B in accordance with some embodiments. During operation of the RPS 164, gas enters a gas port 210 and plasma related products exit through a diffuser hole 208 into the mixing reservoir 156. The diffuser hole 208 may have a diameter of approximately 0.1 inches to approximately 0.2 inches. The upper symmetric electrode 202A and the lower symmetric electrode 202B have a respective upper symmetric cavity 204A and a respective lower symmetric cavity 204B that are configured to produce a hollow cathode effect. The upper symmetric electrode 202A and the lower symmetric electrode 202B are separated by a gap 206. The gap 206 may separate the upper symmetric electrode 202A and the lower symmetric electrode 202B by a distance of approximately 0.2 inches to approximately 0.5 inches. The upper symmetric cavity 204A and the lower symmetric cavity 204B have a cone shape 902 as illustrated in the isometric view of FIG. 9. FIG. 9 depicts a hollow cathode effect cavity 900 in accordance with some embodiments.

In FIG. 9, the cone shape 902 has a vertical axis 904 in a center. At a first end 910 is an opening to fluidly connect with a gas supply (e.g., process gas source 170). The opening at the first end 910 may have a diameter of approximately 0.1 inches to approximately 0.2 inches. At a second end 912 is a larger flared opening that fluidly connects with the gap 206 between the upper symmetric electrode 202A and the lower symmetric electrode 202B. In some embodiments, the cone shape 902 may have a first cone section 914 with a first angle 906 of approximately 10 degrees to approximately 30 degrees. In some embodiments, the cone shape 902 may a second cone section 916 that has a larger flared opening with a second angle 908 of approximately 10 degrees to approximately 60 degrees. In some embodiments, a height 918 of the cone shape 902 may be approximately 1.5 inches to approximately 2 inches.

Figure 8:
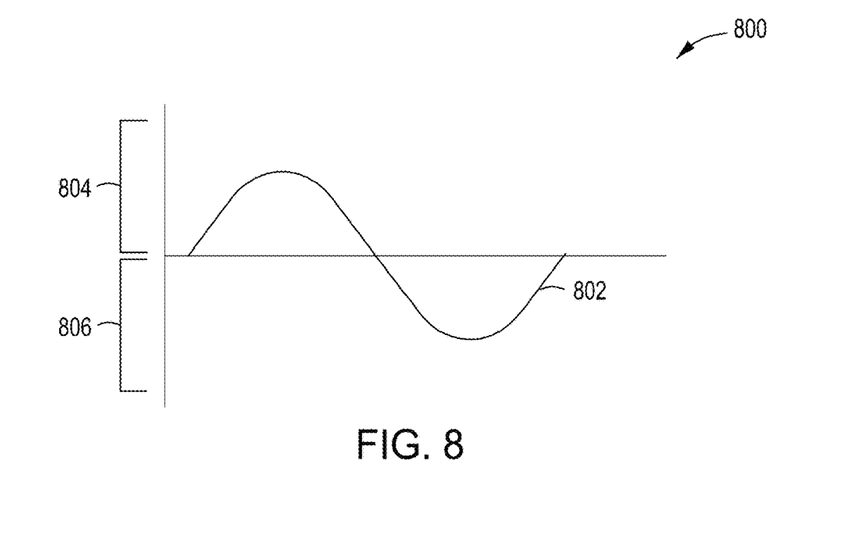
FIG. 8 depicts a graph of a symmetric driving waveform in accordance with some embodiments of the present principles.

The plasma RF power source 166 produces a symmetric driving waveform 802 (e.g., a sinusoidal waveform is shown as a non-limiting example) as illustrated in a graph 800 of FIG. 8. During a cathodic period 806, a hollow cathode mode caused by the upper symmetric cavity 204A forms plasma 212. During an anodic period 804, a hollow cathode mode caused by the lower symmetric cavity 204B forms plasma 212. In conventional systems with a grounding plate for the lower electrode, the anodic period 804 would instead produce a glow discharge mode due to the grounding plate, generating particles that would be detrimental to semiconductor performance. With the upper symmetric electrode 202A and the lower symmetric electrode 202B of the present principles, the particle performance is substantially increased. During testing, the inventors found that when the upper symmetric cavity 204A and the lower symmetric cavity 204B are configured to produce a hollow cathode effect, the RPS 164 had superior particle performance compared to an RPS with parallel flat plane electrodes that produced a glow discharge for both the anodic and cathodic periods of the symmetric driving waveform 802.

During other testing, the inventors found that when a top electrode with a hollow cavity and a bottom electrode that is a plate electrode is used as ground (i.e., "asymmetrical electrodes"), two different plasma modes were generated when the plasma source was driven with a symmetrical waveform. During the anodic period 804, a thin plasma is formed right on top of the plate electrode used as the ground. During the cathodic period 806, a strong hollow cathode effect occurs at the center of the hollow cavity of the top electrode forming plasma at the center ("hollow cathode effect"). The inventors found that the hollow cathode mode improved etch performance. When the driving waveform was changed such that only cathodic periods were present (half sinusoidal waveform), the inventors found an improved etch performance but also found a negative side effect of a buildup of material within the gap separating the top and bottom electrodes of the plasma source.

When the electrodes were changed to parallel flat electrodes with a gap between, a glow discharge mode was created for both anodic and cathodic periods, resulting in a decrease of etch performance and generation of a substantial number of particles. The inventors discovered that using symmetric electrodes with hollow cavities configured to create hollow cathode effect modes for anodic and cathodic periods improved the etch performance substantially over a single cone shaped hollow electrode. In some embodiments, a ceramic ring (see FIG. 3 below) is used to further reduce the glow discharge mode in the gap 206 where the electrodes form parallel surfaces 220 (away from the cone shaped cavities). In some embodiments, a ceramic coating 222 at least on one of the parallel surfaces 220 (top parallel surface 220A of bottom electrode or bottom parallel surface 220B of top electrode) is used to further reduce the glow discharge mode in the gap 206 where the electrodes form parallel surfaces 220 (away from the cone shaped cavities).

Figure 3:
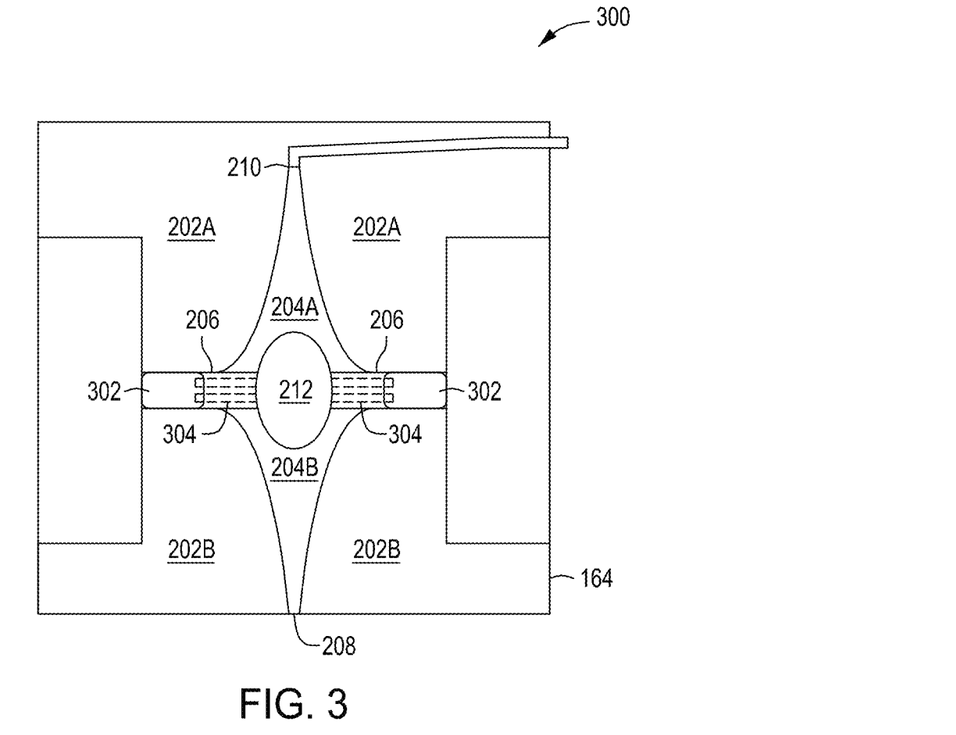
FIG. 3 depicts a schematic cross-sectional view of a plasma source with symmetric electrodes and an isolator in accordance with some embodiments of the present principles.
Figure 4:
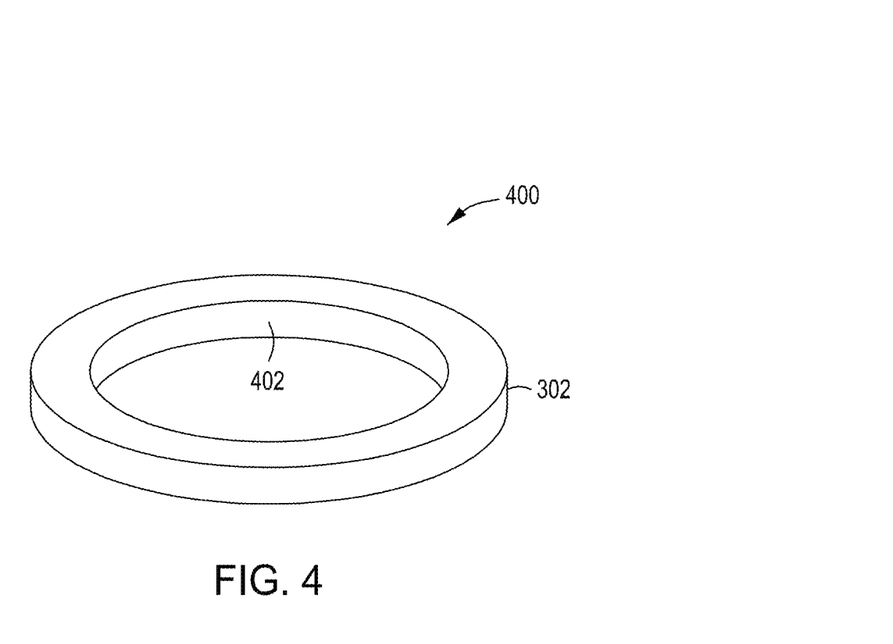
FIG. 4 depicts an isometric view of an isolator in accordance with some embodiments of the present principles.

FIG. 3 depicts a cross-sectional view of a plasma source 300 with an optional isolator 302 between the upper symmetric electrode 202A and the lower symmetric electrode 202B in accordance with some embodiments. The inventors found that using an optional isolator 302 in the gap 206 facilitates in reducing particle buildup on surfaces of the gap 206 by reducing electric fields between the upper symmetric electrode 202A and the lower symmetric electrode 202B. In some embodiments, the optional isolator 302 may be ring shaped and formed from a ceramic-based material. An optional groove 304 may be formed into an interior surface 402 of the optional isolator 302 to increase surface area on the interior of the optional isolator 302. In some embodiments, more than one optional groove 304 may be formed into the interior surface 402 of the optional isolator 302. In some instances, nickel buildup may occur on the interior surface 402 of the optional isolator 302. The addition of the optional groove 304 increases the surface area of the interior surface 402 reducing electrical arcing through the nickel buildup and avoiding electrical discharge between the upper symmetric electrode 202A and the lower symmetric electrode 202B. FIG. 4 depicts an isometric view 400 of the optional isolator 302 in accordance with some embodiments. The interior surface 402 may also have one or more optional grooves (not shown, see FIG. 3).

The parallel surfaces 220 of the gap 206 have a very strong electric field strength compared to the hollow cavities during operation. The strong electric field strength causes high ion energies which forces the ions to repeatedly strike the parallel surfaces 220, sputtering material from the electrode surfaces. In some embodiments, the electrodes are formed of or coated with a nickel-based material which is then sputtered by the high energy ions in the parallel surface regions of the gap. The sputtering may cause nickel particles or nickel buildup due to the ion bombardment. The sputtering may be reduced or eliminated by reducing the electric fields through the use of the optional isolator 302 or ceramic coating 222. The inventors found that by reducing the electric fields in the parallel surface regions of the gap, more current will flow through the hollow cavity regions and amplify the hollow cathode effect of the hollow cavities, substantially increasing the etch performance. For example, the inventors found that using symmetrical electrodes may increase the etch rate by approximately 20 percent to approximately 40 percent. By reducing the electric fields in the parallel surface regions of the gap 206, the inventors found that the etch rate may be increased by 500 percent or more.

Figure 5:
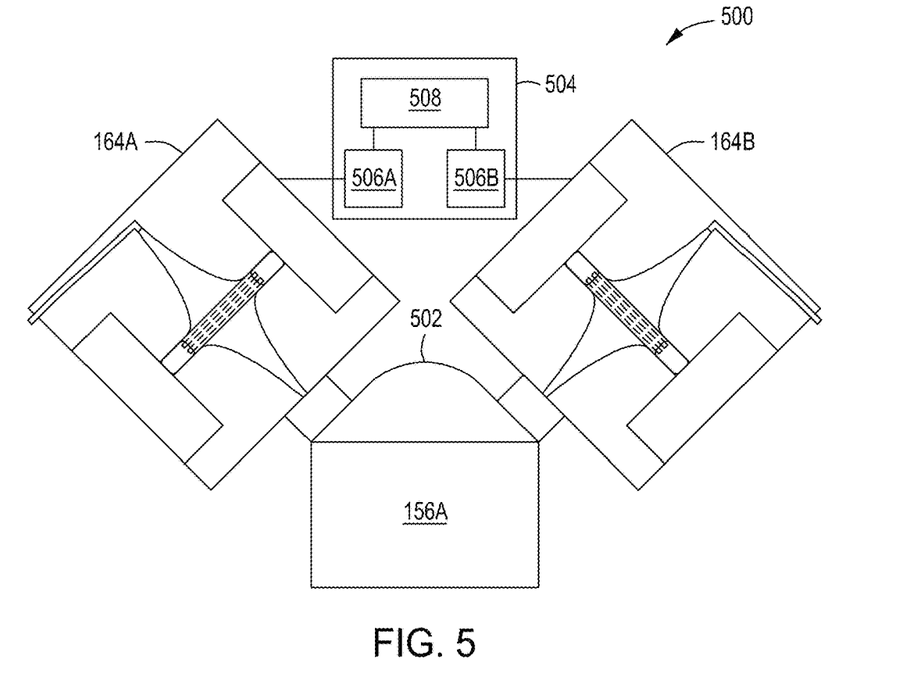
FIG. 5 depicts a schematic cross-sectional view of a remote plasma source with multiple plasma sources with symmetric electrodes in accordance with some embodiments of the present principles.
Figure 6:
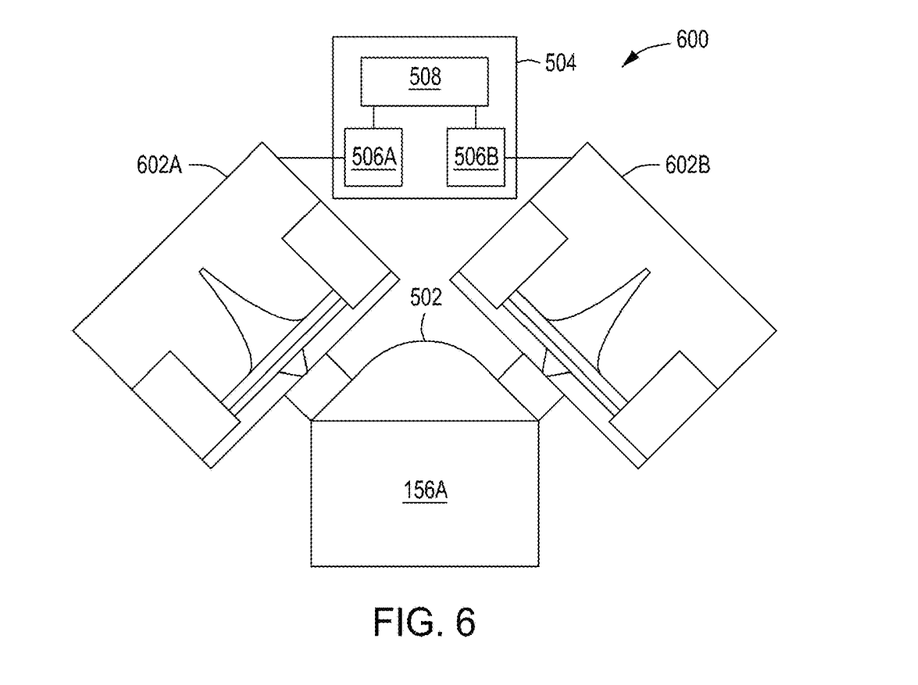
FIG. 6 depicts a schematic cross-sectional view of a remote plasma source with multiple plasma sources in accordance with some embodiments of the present principles.

FIG. 5 depicts a cross-sectional view of a remote plasma source 500 with multiple plasma sources 164A, 164B with symmetric electrodes in accordance with some embodiments. Throughput may be increased by using two or more plasma sources in the RPS 500. In some embodiments, the multiple plasma sources 164A, 164B are mounted to a dome ceiling 502 of a mixing reservoir 156A. The dome ceiling 502 allows the multiple plasma sources 164A, 164B to be mounted at an angle that permits connection of multiple units that feed the mixing reservoir 156A. A plasma RF power system 504 may have one or more plasma RF power supplies 506A, 506B which may provide power independently or in conjunction as determined by power controller 508. FIG. 6 depicts a cross-sectional view of a remote plasma source 600 with multiple plasma sources 602A, 602B in accordance with some embodiments. Throughput is increased but without the benefits of having symmetric electrodes.

Figure 7:
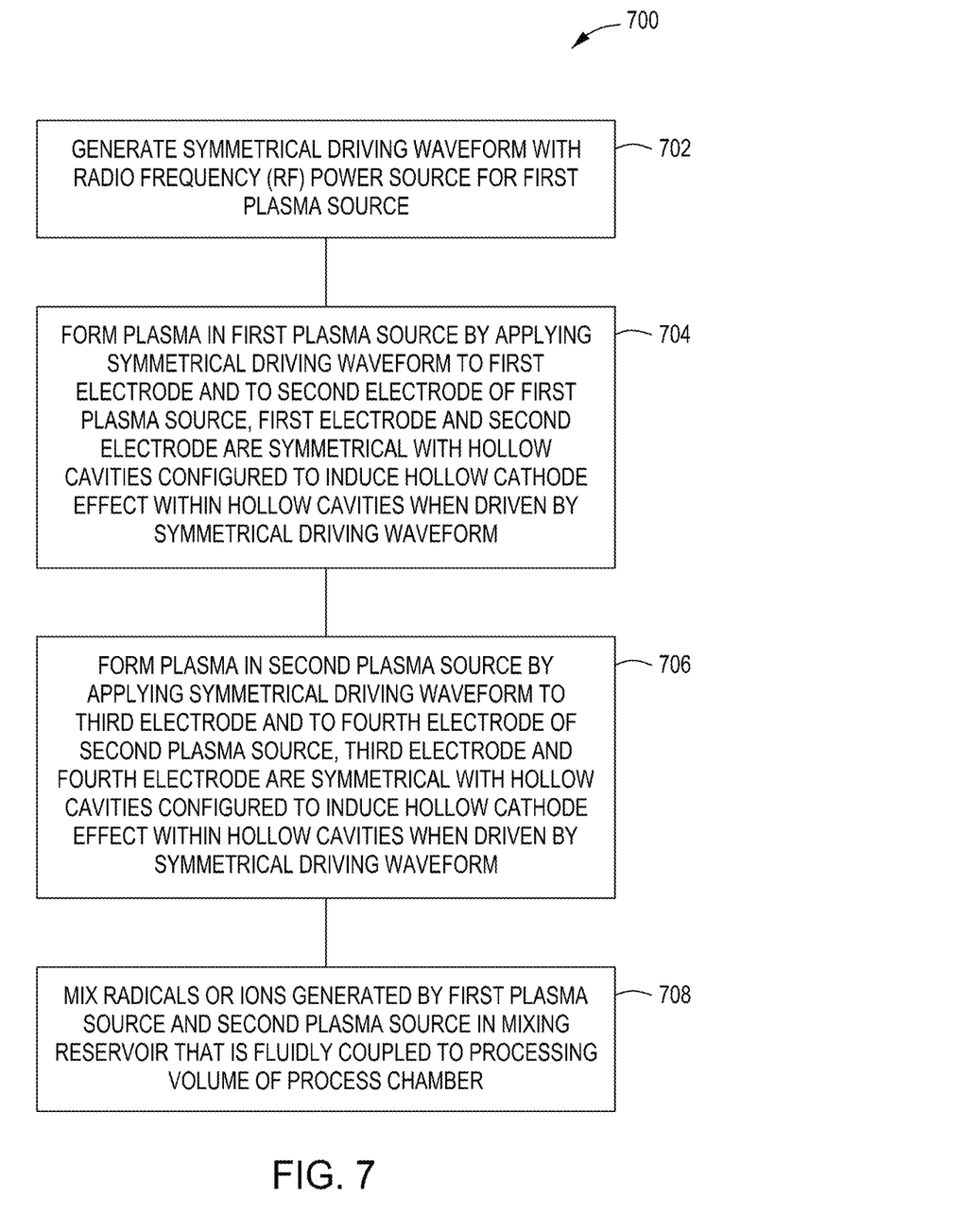
FIG. 7 is a method of remotely generating plasma for a process chamber in accordance with some embodiments of the present principles.

FIG. 7 is a method 700 of remotely generating plasma for a process chamber in accordance with some embodiments. In block 702, a symmetrical driving waveform is generated by an RF power source for a first plasma source in an RPS. In some embodiments, the symmetrical driving waveform may be a sinusoidal waveform or a square wave waveform and the like. The symmetrical waveform has the benefit of neutralizing charged particles that accumulate in a previous cycle. In block 704, plasma is formed in the first plasma source by applying the symmetrical driving waveform to a first electrode and to a second electrode of the first plasma source. The first electrode and the second electrode are symmetrical and have hollow cavities that are configured to induce a hollow cathode effect within the hollow cavities when driven by the symmetrical driving waveform. In some embodiments, the ions and/or radicals from the plasma flows into a mixing reservoir where additional gases may be mixed in. The resulting mixture then flows into a processing volume of a process chamber to process a substrate.

In some embodiments, more than one plasma source may be used. Although examples herein may illustrate two plasma sources for brevity, any number of plasma sources may be used. In optional block 706, plasma is formed in a second plasma source by applying the symmetrical driving waveform to a third electrode and to a fourth electrode of the second plasma source. The third electrode and the fourth electrode are symmetrical and have hollow cavities configured to induce a hollow cathode effect within the hollow cavities when driven by the symmetrical driving waveform. In optional block 708, radicals or ions generated by the first plasma source and the second plasma source are mixed in a mixing reservoir that is fluidly coupled to a processing volume of a process chamber. The mixing of the two plasma sources allows an RPS to increase throughput and/or ion/radical density.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for processing a substrate, comprising:
a process chamber with a chamber body enclosing a processing volume;
a remote plasma source (RPS) having a first plasma source with a first electrode and a second electrode, wherein the first electrode and the second electrode are formed of or coated with a nickel-based material and are symmetrical with hollow cavities having opposing cone shapes with a largest opening of each of the hollow cavities opposing each other, wherein the first electrode and the second electrode are configured to induce a hollow cathode effect within the hollow cavities, wherein the first electrode and the second electrode have parallel surfaces opposing each other that surround the largest opening of each of the hollow cavities and are separated by a gap, wherein the first electrode and the second electrode are at least partially coated with a ceramic material that is configured to reduce sputtering between the parallel surfaces during generation of plasma in the RPS, and wherein the RPS is configured to provide radicals or ions into the processing volume;
a radio frequency (RF) power source configured to provide a symmetrical driving waveform on the first electrode and the second electrode to produce an anodic cycle and a cathodic cycle of the RPS, wherein the anodic cycle and the cathodic cycle operate in a hollow cathode effect mode; and
an isolator with a ring shape positioned between the first electrode and the second electrode and configured to reduce electric fields between the first electrode and the second electrode during generation of plasma in the RPS.

2. The apparatus of claim 1, wherein the symmetrical driving waveform is a sinusoidal waveform or a square wave waveform.

3. The apparatus of claim 1, wherein the cone shapes have an angle of approximately 10 degrees to approximately 30 degrees.

4. The apparatus of claim 1, wherein a smallest opening of the cone shapes opposite of the largest opening is approximately 0.1 inches to approximately 0.2 inches in diameter.

5. The apparatus of claim 1, wherein a height of the cone shapes is approximately 1.5 inches to approximately 2 inches.

6. The apparatus of claim 1, wherein the first electrode has a gas port connected to a gas supply and the second electrode has a diffuser hole configured to provide radicals or ions into the processing volume.

7. The apparatus of claim 1, wherein the isolator has at least one groove on a radially inward side of the ring shape that is configured to be exposed to generated plasma from the first electrode and the second electrode.

8. The apparatus of claim 1, wherein the isolator is formed of a ceramic material.

9. The apparatus of claim 1, further comprising:
a mixing reservoir located between the first plasma source and the processing volume.

10. The apparatus of claim 1, further comprising:
a second plasma source with a third electrode and a fourth electrode, wherein the third electrode and the fourth electrode are symmetrical with hollow cavities configured to induce a hollow cathode effect within the hollow cavities.

11. The apparatus of claim 10, wherein the first plasma source and the second plasma source provide radicals or ions into a mixing reservoir that is fluidly connected to the processing volume.

12. An apparatus for processing a substrate, comprising:
a remote plasma source (RPS) having a first plasma source with a first electrode and a second electrode, wherein the first electrode and the second electrode are formed of or coated with a nickel-based material and are symmetrical with hollow cavities having opposing cone shapes with a largest opening of each of the hollow cavities opposing each other, wherein the first electrode and the second electrode are configured to induce a hollow cathode effect within the hollow cavities,
wherein the first electrode and the second electrode have parallel surfaces opposing each other that surround the largest opening of each of the hollow cavities and are separated by a gap, and wherein the first electrode and the second electrode are at least partially coated with a ceramic material that is configured to reduce sputtering between the parallel surfaces during generation of plasma in the RPS;
a radio frequency (RF) power source configured to provide a symmetrical driving waveform on the first electrode and the second electrode to produce an anodic cycle and a cathodic cycle of the RPS, wherein the anodic cycle and the cathodic cycle operate in a hollow cathode effect mode; and
an isolator with a ring shape positioned between the first electrode and the second electrode and configured to reduce electric fields between the first electrode and the second electrode during generation of plasma in the RPS.

13. The apparatus of claim 12, wherein symmetrical driving waveform is a sinusoidal waveform or a square wave waveform.

14. The apparatus of claim 12, wherein the isolator is formed of a ceramic based material.

15. The apparatus of claim 12, wherein the cone shapes have an angle of approximately 10 degrees to approximately 30 degrees.

16. The apparatus of claim 12, wherein a smallest opening of the cone shapes opposite of the largest opening is approximately 0.1 inches to approximately 0.2 inches in diameter and wherein a height of the cone shapes is approximately 1.5 inches to approximately 2 inches.

17. The apparatus of claim 12, further comprising:
a second plasma source with a third electrode and a fourth electrode, wherein the third electrode and the fourth electrode are symmetrical with hollow cavities configured to induce a hollow cathode effect within the hollow cavities, and wherein the first plasma source and the second plasma source provide radicals or ions into a
mixing reservoir that is fluidly connected to a processing volume of a process chamber.

18. A method of generating remote plasma for a process chamber, comprising:
generating a symmetrical driving waveform with a radio frequency (RF) power source for a first plasma source;
forming plasma in the first plasma source by applying the symmetrical driving waveform to a first electrode and to a second electrode of the first plasma source, wherein the first electrode and the second electrode are formed of or coated with a nickel-based material and are symmetrical with hollow cavities having opposing cone shapes with a largest opening of each of the hollow cavities opposing each other, wherein the first electrode and the second electrode are configured to induce a hollow cathode effect within the hollow cavities, wherein the first electrode and the second electrode have parallel surfaces opposing each other that surround the largest opening of the hollow cavities and are separated by a gap, and wherein the first electrode and the second electrode are at least partially coated with a ceramic material that is configured to reduce sputtering between the parallel surfaces during generation of plasma in the first plasma source; and
reducing electric fields between the first electrode and the second electrode during formation of plasma by positioning an isolator with a ring shape between the first electrode and the second electrode.

19. The method of claim 18, further comprising:
forming plasma in a second plasma source by applying the symmetrical driving waveform to a third electrode and to a fourth electrode of the second plasma source, wherein the third electrode and the fourth electrode are symmetrical with hollow cavities configured to induce a hollow cathode effect within the hollow cavities when driven by the symmetrical driving waveform.

20. The method of claim 19, further comprising:
mixing radicals or ions generated by the first plasma source and the second plasma source in a mixing reservoir that is fluidly coupled to a processing volume of a process chamber.

\* \* \* \* \*